US010688732B2

(12) United States Patent
Liu (10) Patent No.: US 10,688,732 B2
(45) Date of Patent: Jun. 23, 2020

(54) THREE DIMENSIONAL PRINTING DEVICE

(71) Applicant: Young Optics Inc., Hsinchu (TW)

(72) Inventor: Tsung-Yu Liu, Hsinchu (TW)

(73) Assignee: Young Optics Inc., Hsinchu (TW)

( * ) Notice: Subject to any disclaimer, the term of this patent is extended or adjusted under 35 U.S.C. 154(b) by 322 days.

(21) Appl. No.: 15/629,918

(22) Filed: Jun. 22, 2017

(65) Prior Publication Data

US 2018/0370153 A1    Dec. 27, 2018

(51) Int. Cl.
| | | |
|---|---|---|
| *B29C 64/124* | (2017.01) | |
| *B29C 64/135* | (2017.01) | |
| *B29C 64/255* | (2017.01) | |
| *B29C 64/336* | (2017.01) | |
| *B29C 67/00* | (2017.01) | |
| *B29C 35/08* | (2006.01) | |
| *B33Y 50/02* | (2015.01) | |
| *C09D 11/101* | (2014.01) | |
| *G03F 7/00* | (2006.01) | |
| *B33Y 30/00* | (2015.01) | |
| *B33Y 10/00* | (2015.01) | |

(52) U.S. Cl.
CPC .......... *B29C 67/0066* (2013.01); *B29C 35/08* (2013.01); *B29C 64/124* (2017.08); *B29C 64/135* (2017.08); *B29C 64/255* (2017.08); *B33Y 30/00* (2014.12); *B33Y 50/02* (2014.12); *C09D 11/101* (2013.01); *G03F 7/0037* (2013.01); *B29C 64/336* (2017.08); *B33Y 10/00* (2014.12)

(58) Field of Classification Search
None
See application file for complete search history.

(56) References Cited

U.S. PATENT DOCUMENTS

| | | | |
|---|---|---|---|
| 8,801,418 B2 | 8/2014 | El-Siblani et al. | |
| 9,434,838 B2 | 9/2016 | Jung et al. | |
| 2011/0089610 A1* | 4/2011 | El-Siblani | B29C 33/44 264/401 |
| 2014/0170591 A1* | 6/2014 | El-Siblani | A61C 13/34 433/36 |
| 2015/0019000 A1* | 1/2015 | Nakamura | G05D 25/02 700/120 |
| 2015/0142159 A1 | 5/2015 | Chang | |
| 2015/0287169 A1* | 10/2015 | Ueda | G06T 7/33 348/86 |
| 2015/0375451 A1 | 12/2015 | Voris et al. | |
| 2016/0368221 A1* | 12/2016 | Ueda | B29C 64/129 |
| 2017/0021452 A1* | 1/2017 | Tanaka | B29C 70/386 |
| 2017/0274602 A1* | 9/2017 | Kobayashi | B29C 64/307 |
| 2018/0029296 A1* | 2/2018 | Van Esbroeck | B29C 64/255 |
| 2018/0188711 A1* | 7/2018 | Sakurai | G05B 19/4099 |
| 2018/0205917 A1* | 7/2018 | Ueda | H04N 9/3105 |

* cited by examiner

Primary Examiner — Jacob T Minskey
Assistant Examiner — Baileigh Kate Darnell (57) ABSTRACT

A three dimensional printing device includes a plane, a projector, a separation mechanism, and a driving mechanism. The plane is used to put a first photocured material and a second photocured material. The projector emits a light to cure the first photocured material and the second photocured material. The separation mechanism is disposed on the plane and used for separating the first photocured material and the second photocured material, and the driving mechanism drives the separation mechanism to change a location of the first photocured material on the plane.

20 Claims, 9 Drawing Sheets

THREE DIMENSIONAL PRINTING DEVICE

FIELD OF THE INVENTION

The present invention relates to a printing device, and more particularly to a three dimensional printing device.

BACKGROUND OF THE INVENTION

A three dimensional printing apparatus for photocured molding comes out at present, in which the photocured molding is the technology of curing a photocured material for molding by the irradiation from a beam. However, some conventional three-dimensional printing apparatuses are unable to change the photocured material during the printing process, so that the conventional three-dimensional printing apparatus can only manufacture an object composed of one kind of material. Other conventional three-dimensional printing apparatuses which can change the photocured material during the printing process have complicated-structures and high cost.

SUMMARY OF THE INVENTION

An embodiment of the present invention provides a three dimensional printing device including a plane, a projector, a separation mechanism, and a driving mechanism. The plane can put the first photocured material and the second photocured material. The projector can emit a light to cure the first photocured material and the second photocured material. The separation mechanism disposed on the plane separate the first photocured material and the second photocured material from each other, and the driving mechanism drives the separation mechanism to change the location of the first photocured material on the plane.

The embodiment of the present invention with a simple structure can use at least two kinds of photocured materials for performing printing processes, so as to manufacture a three-dimensional object made of a variety of photocured materials because of the use of the separation mechanism separating a plurality of photocured materials (e.g. the first photocured material and the second photocured material) from each other.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
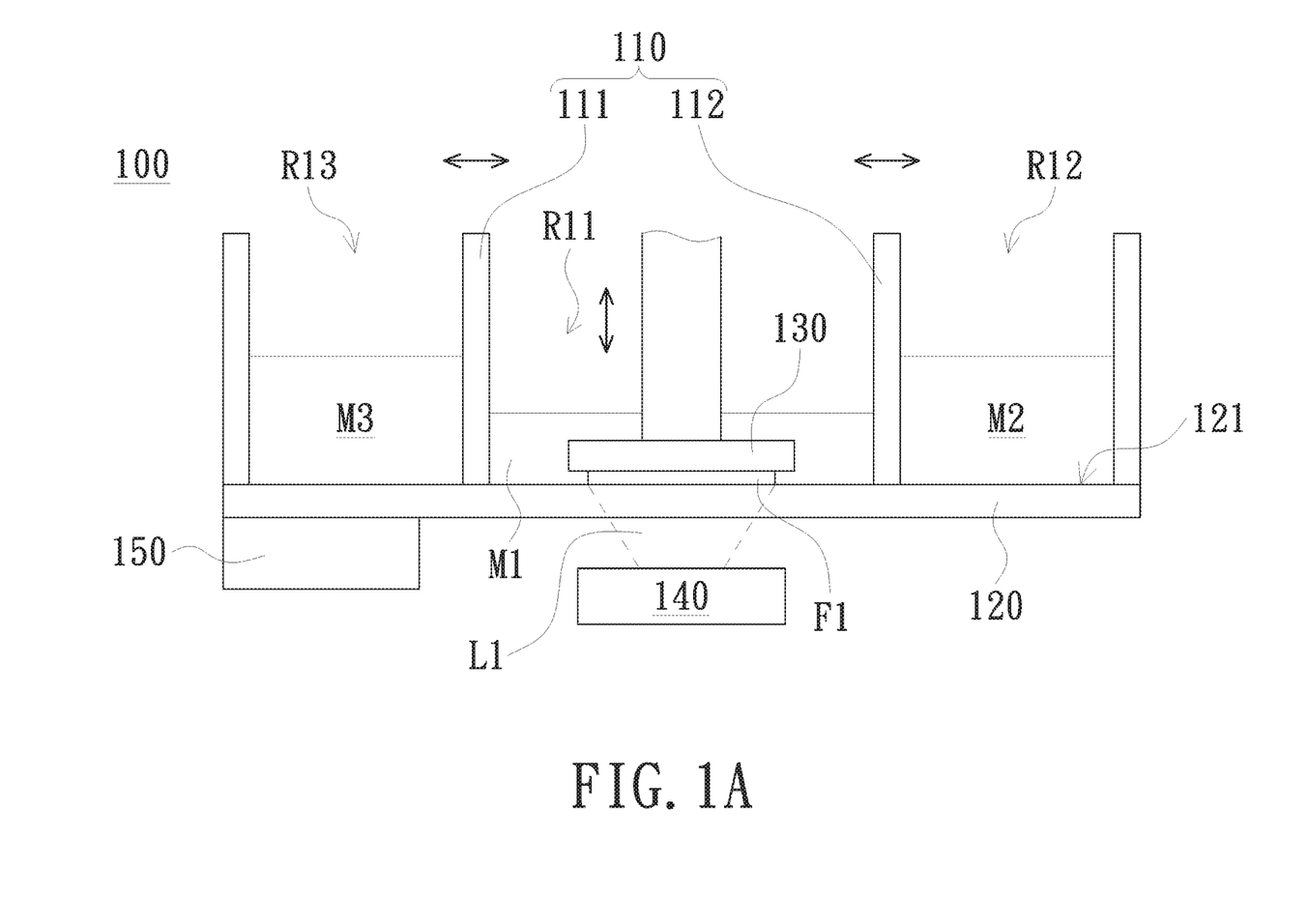
FIGS. 1A to 1B are schematic views of the three dimensional printing device according to an embodiment of the present invention.
Figure 1B:
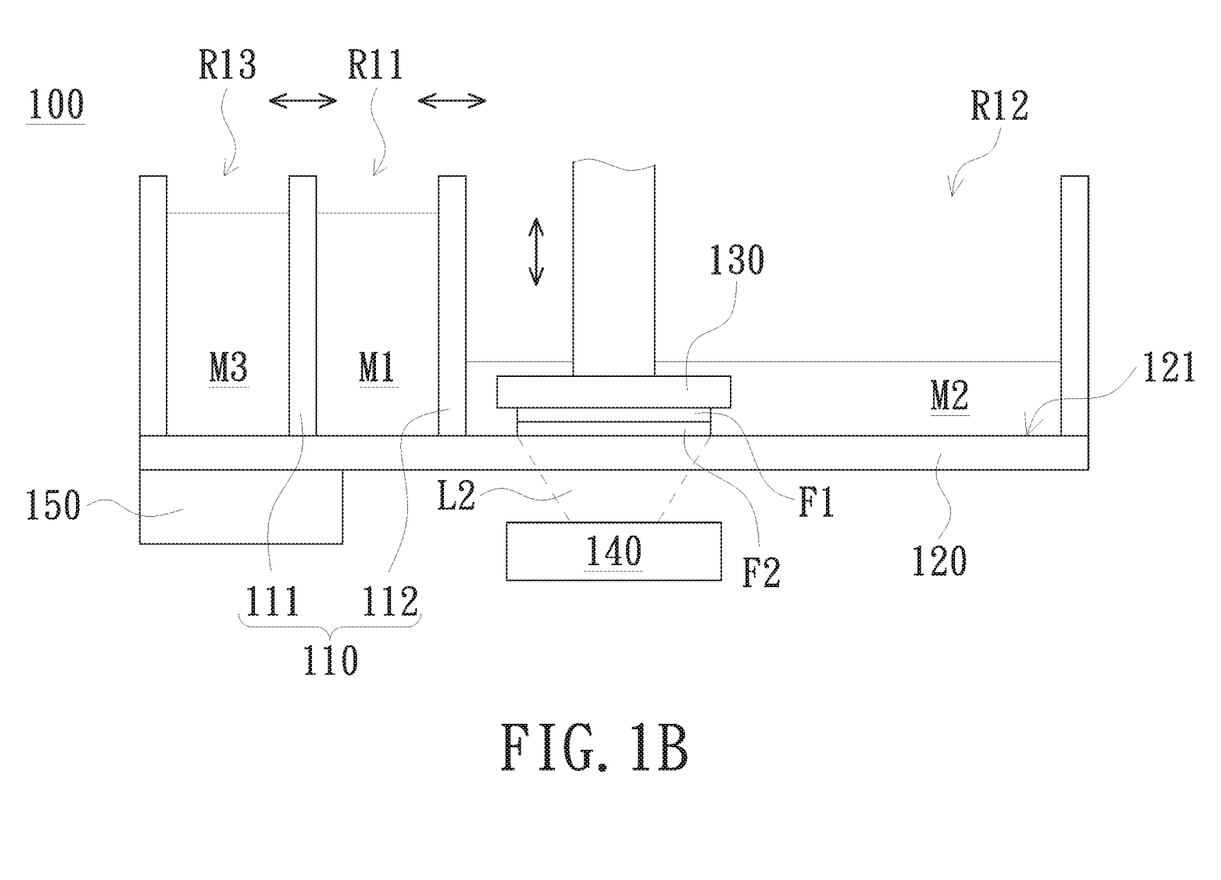

Referring the FIGS. 1A and 1B, a three dimensional printing device 100 includes a separation mechanism 110, a putting base 120, a printing platform 130, a projector (or light engine) 140 and a driving mechanism 150. The putting base 120 can put at least two photocured materials. Taking FIGS. 1A and 1B as example, the putting base 120 has a plane 121, which can put the first photocured material M1, the second photocured material M2, and the third photocured material M3, wherein the first photocured material M1, the second photocured material M2, and the third photocured material M3 are different from each other. For example, the first photocured material M1 is different from the second photocured material M2, or the first to the third photocured materials M1, M2, and M3 have different colors. However, the present invention is not limited thereto.

The separation mechanism 110 is disposed on the plane 121, and can separate the first photocured material M1, the second photocured material M2, and the third photocured material M3 from each other, and the driving mechanism 150 drives the separation mechanism 110 to move on the plane 121, so that the locations of the first photocured material M1, the second photocured material M2, and the third photocured material M3 can be changed. The separation mechanism 110 includes at least one movable partition, such as at least two movable partitions 111 and 112 shown in FIGS. 1A and 1B, but in one embodiment, the separation mechanism 110 only includes a movable partition or more than three movable partitions, but the present invention is not limited thereto. The putting base 120 and the movable partitions 111 and 112 can form three accommodation spaces R11, R12, and R13, and the first photocured material M1, the second photocured material M2, and the third photocured material M3 are put in the accommodation spaces R11, R12, and R13 respectively.

The driving mechanism 150 includes a power source and a transmission assembly connected to the power source, wherein the power source is such as a motor, and the transmission assembly is connected to the movable partitions 111 and 112, and may consist of gears, pulleys, a belt, or other mechanical parts, or any combination of these mechanical parts. Therefore, the driving mechanism 150 can drive the separation mechanism 110 to move, so that the movable partitions 111 and 112 can push and separate the first photocured material M1, the second photocured material M2, and the third photocured material M3 on the plane 121.

The printing platform 130 may be disposed above the plane 121, and the printing platform 130 and the projector 140 are located on two sides of the plane 121. The printing platform 130 can move in the directions close to and away from the plane 121, so that the bottom of the printing platform 130 can be soaked in the photocured material (i.e. the first photocured material M1, the second photocured material M2, or the third photocured material M3). The projector 140 may be disposed under the plane 121 and emit a beam to the plane 121, which can penetrate the plane 121 and cure the first photocured material M1, the second photocured material M2 and the third photocured material M3. The beam that the projector 140 emits is a pattern beam, and the first photocured material M1, the second photocured material M2, and the third photocured material M3 can be cured according to the shape of the pattern beam, so as to form a solid pattern. In one embodiment, the projector 140 may be disposed above the putting base 120, and the printing platform 130 may be disposed under the projector 140, but the present invention is not limited thereto.

Referring to FIG. 1A, When the three dimensional printing device 100 performs the printing process, first, the first photocured material M1, the second photocured material M2 and the third photocured material M3 put in the accommodation space R11, R12, and R13 on the plane 121 respectively. Then, the printing platform 130 moves in the direction close to the plane 121, so that the printing platform 130 enters the accommodation space R11, and the bottom of the printing platform 130 can be soaked in the first photocured material M1. Next, the projector 140 emits the pattern beam L1, which penetrates the plane 121 to the first photocured material M1. Therefore, the first photocured material M1 irradiated by the pattern beam L1 can be cured to form a first solid pattern F1 on the printing platform 130. After forming the first solid pattern F1, the projector 140 stop emitting the pattern beam L1, and the printing platform 130 moves in the direction away from the projector 140, so that the first solid pattern F1 is separated from the plane 121. Next, repeat the previous steps until the other photocured material is used for printing, so that the printing platform 130 leaves the accommodation space R11 and the first photocured material M1.

Referring to FIG. 1B, the next printing process is performed. The driving mechanism 150 drives the movable partitions 111 and 112 to move on the plane 121, so that the locations of the first photocured material M1, the second photocured material M2, and the third photocured material M3 on the plane 121 can be changed. Taking FIG. 1B as example, the first photocured material M1, which was previously printed, is moved by movable partition 111 and 112 to the left side of the printing platform 130, so that the accommodation space R12 become big and can accommodate the entrance of the printing platform 130. Then, the printing platform 130 moves in the direction close to the plane 121 to enter the accommodation space R12, so that the bottom of the printing platform 130 can be soaked in the second photocured material M2. Afterwards, the projector 140 emits a pattern beam L2 penetrating the plane 121 to cure the second photocured material M2 to form a second solid pattern F2 on the first solid pattern F1. The pattern beam L2 is different from the pattern beam L1, but in one embodiment, the pattern beam L2 may be the same as the pattern beam L1, and the present invention is not limited thereto. After forming the second solid pattern F2, the projector 140 stop emitting the pattern beam L2, and the printing platform 130 moves in the direction away from the projector 140 again, so as to separate the second solid pattern F2 and the plane 121. Next, repeat the previous steps until the other photocured material is used for printing, so that the printing platform 130 leaves the accommodation space R12 and the second photocured material M2.

When the next printing process is performed again to form another solid pattern, the drive mechanism 150 drives the movable partitions 111 and 112 to move on the plane 121 again to change the locations of the first photocured material M1, the second photocured material M2 and the third photocured on the plane 121 in the same way, thereby causing that bottom of the printing platform 130 can be soaked in the photocured material to be printed. Therefore, the three dimensional printing device 100 can perform a printing process with at least two different photocured materials (e.g. the photocured materials with different colors) to make an object consisting of different kinds of the solid patterns (or colors).

Figure 2:
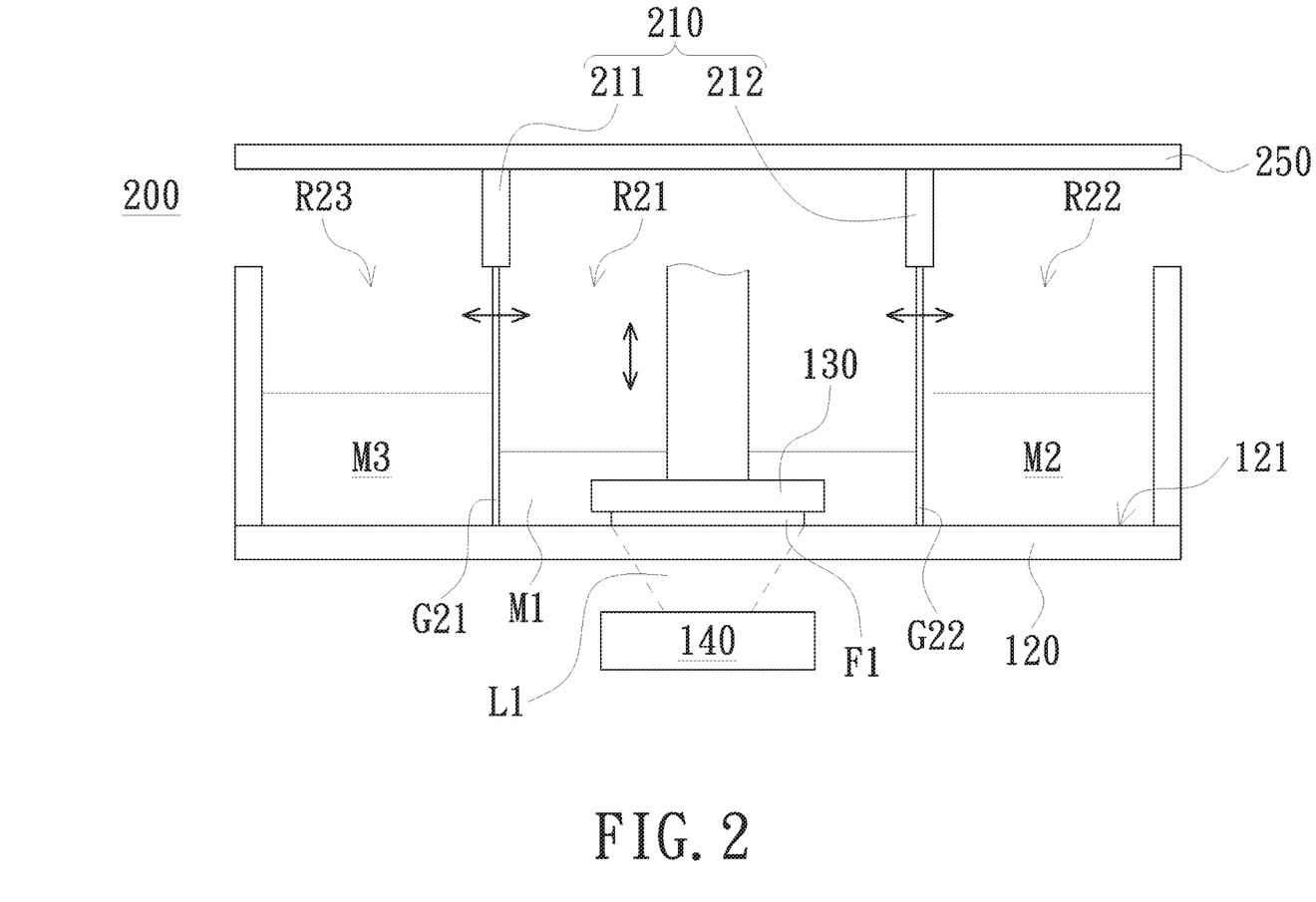
FIG. 2 is a schematic view of the three dimensional printing device according to another embodiment of the present invention.

FIG. 2 is a schematic view of the three dimensional printing device according to another embodiment of the present invention. Refer to FIG. 2, which illustrates a three dimensional printing device 200. The following describes the difference between the three dimensional printing devices 200 and 100 without repeating the same of both.

The three dimensional printing device 200 includes a separation mechanism 210 and a driving mechanism 250, wherein the separation mechanism 210 includes two nozzles 211 and 212. However, in one of the embodiments, the separation mechanism 210 includes only one nozzle, or more than three nozzles, and the present invention is not limited thereto. The driving mechanism 250 can drive the nozzles 211 and 212 on the plane 121, so that the locations of the first photocured material M1, the second photocured material M2, and the third photocured material M3 on the plane 121 can be changed. The nozzles 211 and 212 can generate jet gas flows G21 and G22 respectively, which can blow the first to third photocured materials M1, M2, and M3, thereby forming the accommodation spaces R21, R22 and R23. The driving mechanism 250 can drive the nozzles 211 and 212 to move, so as to drive the first photocured material M1, the second photocured material M2, and the third photocured material M3 to move. Therefore, the locations of the first photocured material M1, the second photocured material M2, and the third photocured material M3 on the plane 121 can be changed and disposed in the accommodation spaces R21, R22, and R23 respectively. The driving mechanism 250 may be the same as the driving mechanism 150 and include a power source and a transmission assembly connected to the power source, wherein the power source is such as a motor, and the transmission assembly may consist of gears, pulleys, a belt, or other mechanical parts, or any combination of these mechanical parts. In addition, the processes of the three dimensional printing devices 200 and 100 are the same and thus are not described again.

Figure 3A:
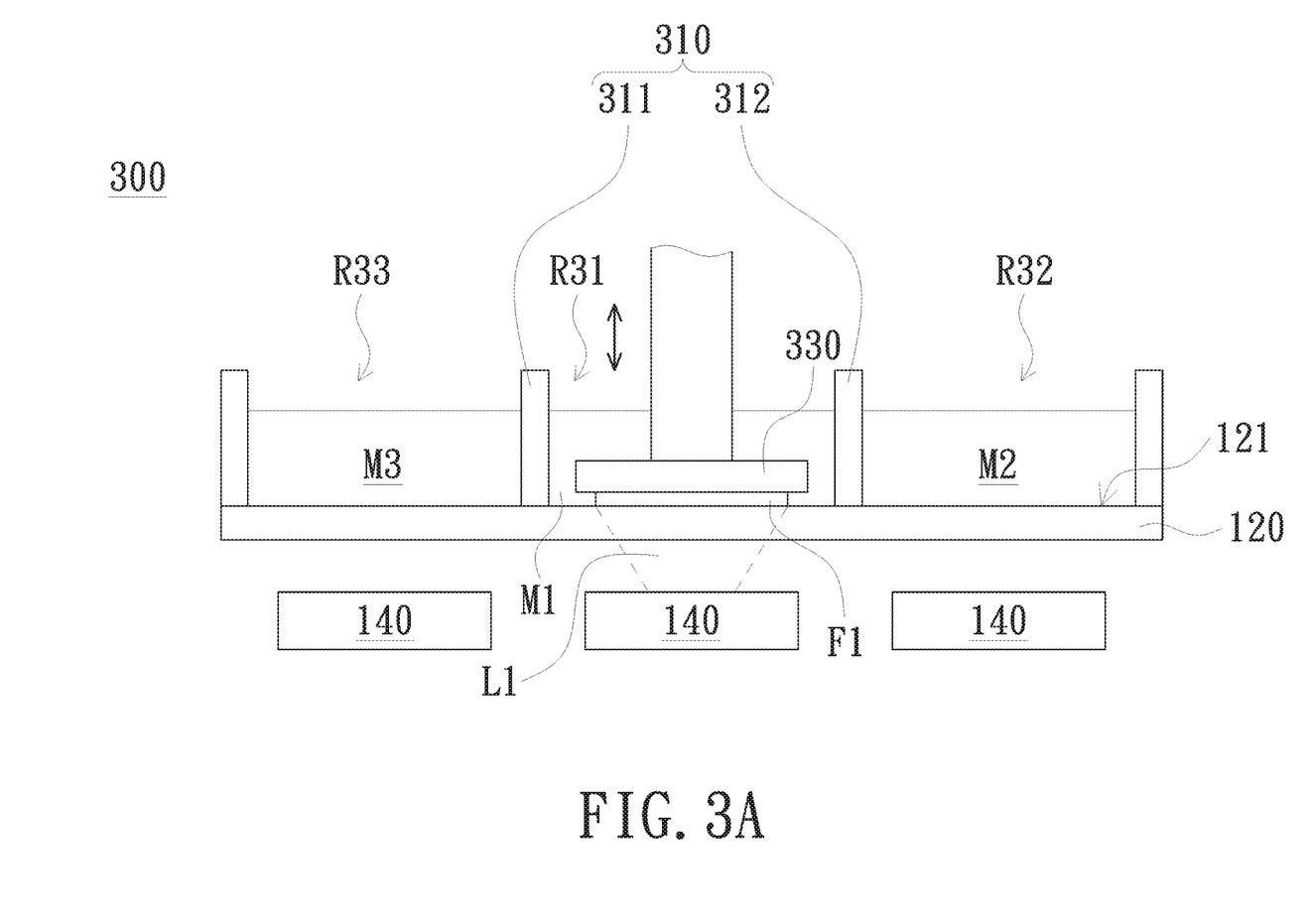
FIGS. 3A to 3C are schematic views of the three dimensional printing device according to another embodiment of the present invention.
Figure 3B:
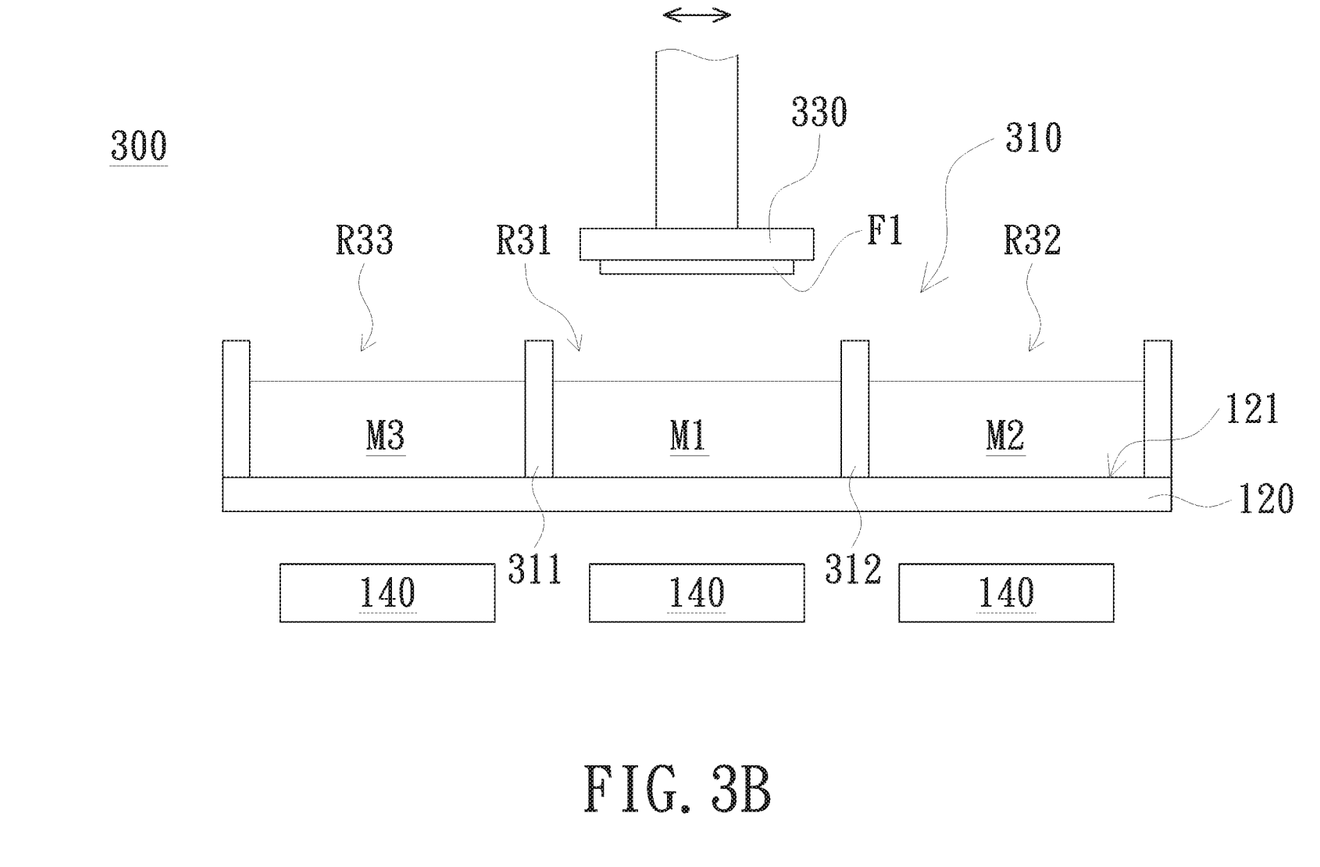
Figure 3C:
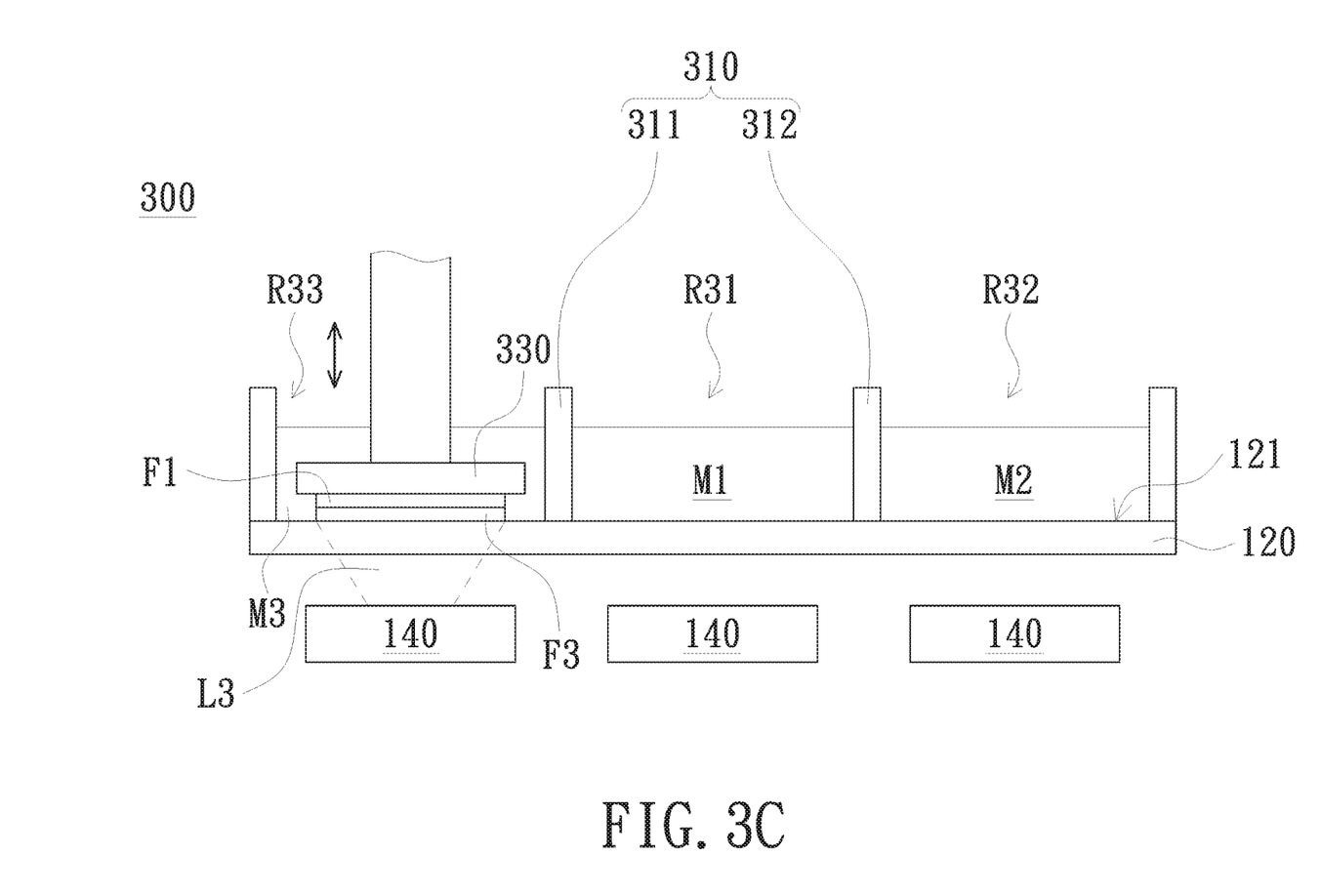

FIGS. 3A to 3C are schematic views of the three dimensional printing device according to another embodiment of the present invention. Referring to FIG. 3A, unlike the three dimensional printing devices 100 and 200, in the three dimensional printing device 300 of this embodiment, the separation mechanism 310 disposed on the plane 121 also can separate the first to the third photocured materials M1, M2, and M3, but the separation mechanism 310 on the plane 121 is fixed, wherein the separation mechanism 310 may include fixed partitions 311 and 312, and the fixed partitions 311 and 312 can separate the first photocured material M1, the second photocured material M2, and the third photocured material M3. The separation mechanism 310 and the putting base 120 may be integrally formed into one. Moreover, in one embodiment, the separation mechanism 310 includes only one fixed partition, or more than three fixed partitions, and the present invention is not limited thereto.

In the previous embodiment, the printing platform 130 only can move vertically, but in the present embodiment, the printing platform 330 included by the three dimensional printing device 300 not only can move vertically but also can move horizontally above the plane 121, so that the printing platform 330 can move from one side of the separation mechanism 310 to the other side of the separation mechanism 310. In addition, the number of the projector 140 included by three dimensional printing device 300 may be plural. For example, in the embodiment, the three dimensional printing device 300 includes three projectors 140 disposed under the plane 121, which are located directly under the first photocured material M1, the second photocured material M2, and the third photocured material M3 respectively.

Referring to FIGS. 3A and 3B, when the first photocured material M1, the second photocured material M2, and the third photocured material M3 are respectively put in the accommodation space R31, R32, and R33 on the plane 121 to perform the printing process, the printing platform 330 moves in the direction close to the plane 121, so that the bottom of the printing platform 330 can be soaked in the first photocured material M1. Then, in the projectors 140, only the projector 140 located directly under the first photocured material M1 emits the pattern beam L1 penetrating the plane 121 to cure the first photocured material M1, thereby forming the first solid pattern F1 on the printing platform 330, whereas the other projectors 140 do not emit any light. Afterwards, the projector 140 stops emitting the pattern beam L1 to separate the first solid pattern F1 and the plane 121 from each other. Next, repeat the previous steps until the other photocured material is used for printing, so that the printing platform 330 leaves the accommodation space R31.

Referring to FIGS. 3B and 3C, after the printing platform 330 leaves the accommodation space R31, the printing platform 330 can move horizontally from one side of the fixed partition 311 to the other side of the fixed partition 311, for example, from above the accommodation space R31 to above the accommodation space R33. Afterwards, the printing platform 330 moves in the direction close to the plane 121, so that the bottom of the printing platform 330 can be soaked in the third photocured material M3. Next, another projector 140 directly under the third photocured material M3 emits the pattern beam L3 to cure the third photocured material M3, thereby forming a third solid pattern F3 on the first solid pattern F1, but the other projectors 140 do not emit lights. Then, the projector 140 stops emitting the pattern beam L3, so as to separated the third solid pattern F3 and the plane 121 from each other. Next, repeat the previous steps until the other photocured material is used for printing, so that the printing platform 330 leaves the accommodation space R33. Likewise, when the next printing process is performed again to form another solid pattern, the printing platform 330 can move horizontally again to move above the photocured material to be printed, and the projector 140 directly under the photocured material emits the pattern beam to perform the printing process. Therefore, the three dimensional printing device 300 of the embodiment can print three different kinds of the photocured materials (e.g. photocured materials with different colors).

Figure 4A:
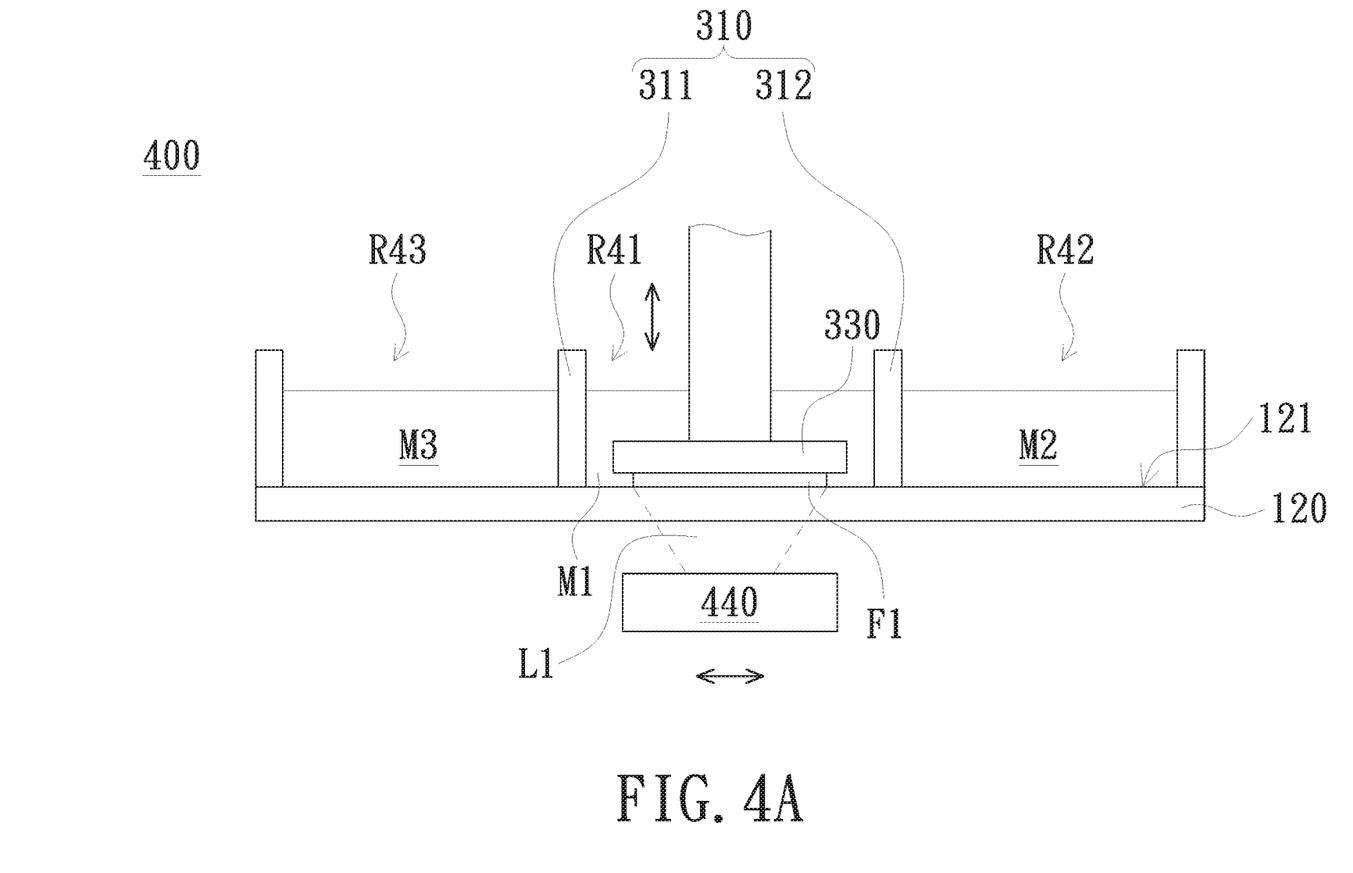
FIGS. 4A to 4C are schematic views of the three dimensional printing device according to another embodiment of the present invention.
Figure 4B:
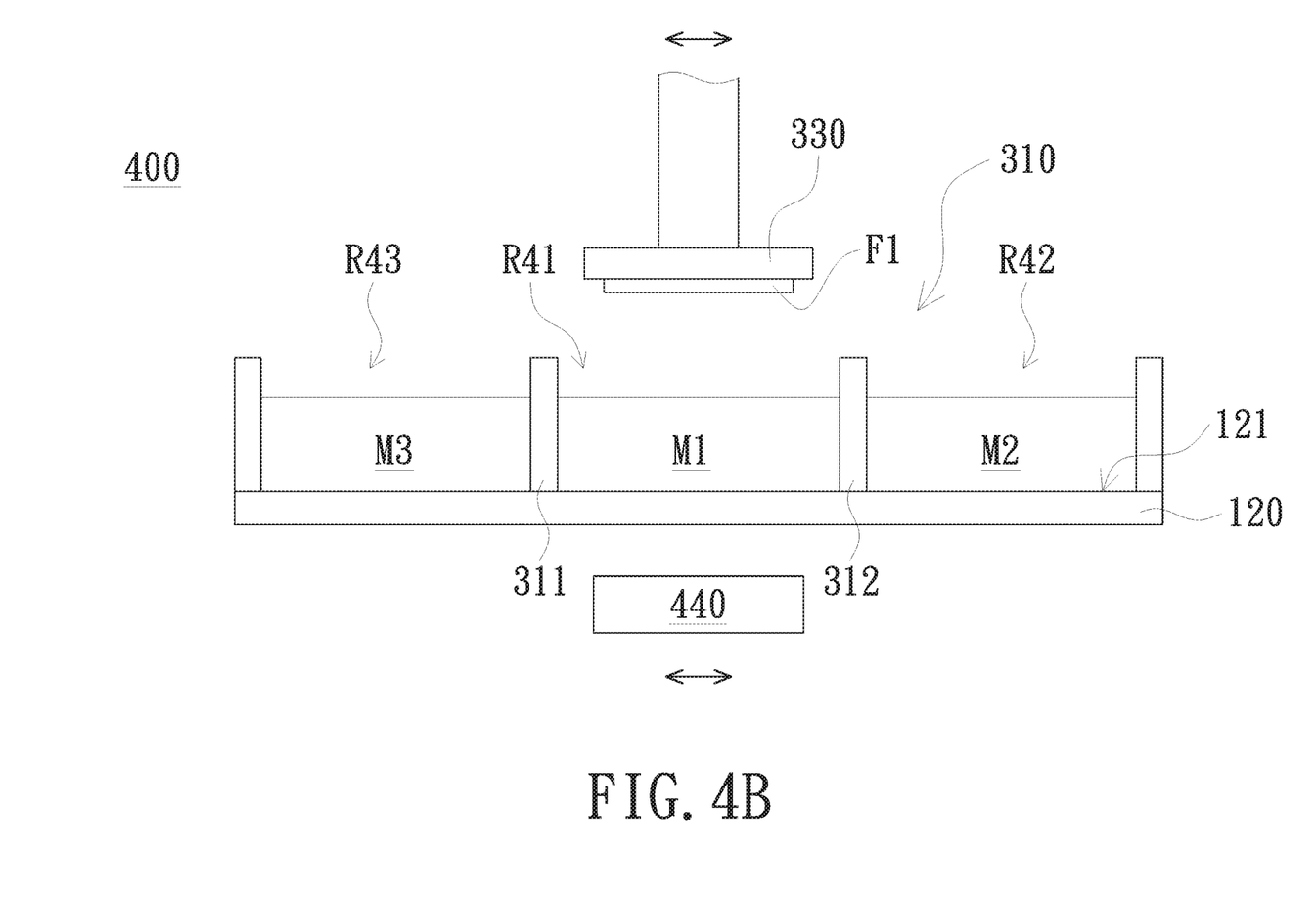
Figure 4C:
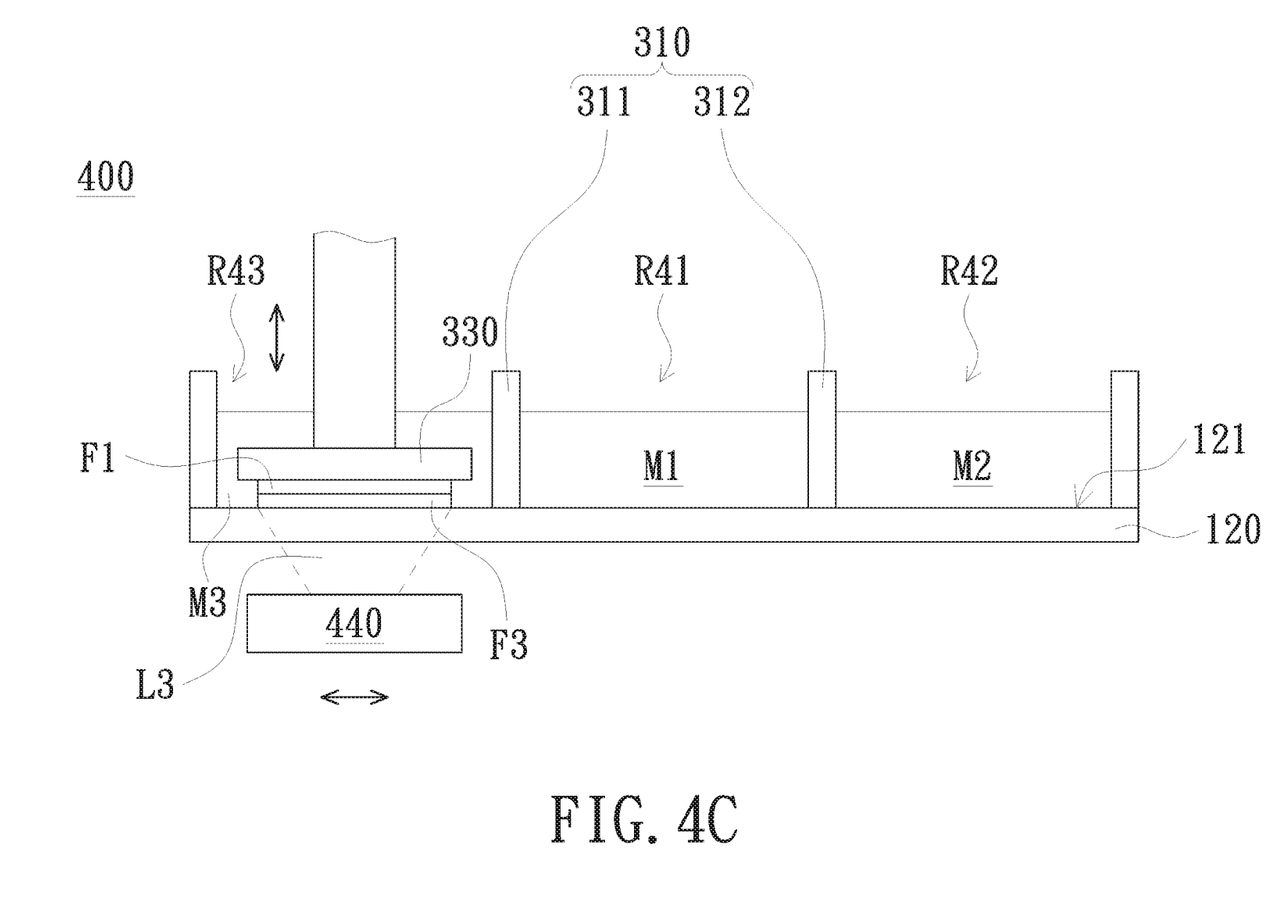

FIGS. 4A to 4C are schematic views of the three dimensional printing device according to another embodiment of the present invention. Refer to FIG. 4A, which illustrates a three dimensional printing device 400. The following describes the difference between the three dimensional printing devices 400 and 300 without repeating the same of both.

The three dimensional printing device 400 of the embodiment includes only one projector 440, and the projector 440 can move under the plane 121 horizontally and synchronously with the printing platform 330. For example, referring to FIGS. 4A and 4B, when the three dimensional printing device 400 performs the printing process, the printing platform 330 moves in the direction close to the plane 121 to enter the accommodation space R41 containing the first photocured material M1, and the projector 440 located directly under the first photocured material M1 emits the pattern beam L1 to cure the first photocured material M1, thereby forming the first solid pattern F1 on the printing platform 330. Afterwards, the projector 440 stops emitting the pattern beam L1 to separate the first solid pattern F1 and the plane 121 from each other. Next, repeat the previous steps until the other photocured material is used for printing, so that the printing platform 330 moves in the direction away from the projector 440 to leave the accommodation space R41.

Referring to FIGS. 4B and 4C, afterwards, the printing platform 330 moves horizontally again to move from one side of the fixed partition 311 to the other side of the fixed partition 311, so that the printing platform 330 can move from above the accommodation space R41 to above the accommodation space R43, wherein the accommodation space R43 contains the third photocured material M3. Meanwhile, the projector 440 also moves horizontally with the printing platform 330 to move under the accommodation space R43. Afterwards, the printing platform 330 moves in the direction close to the plane 121, so that the bottom of the printing platform 330 can be soaked in the third photocured material M3. Next, the projector 440 which has moved directly under the third photocured material M3 emits the pattern beam L3 to cure the third photocured material M3, thereby forming the third solid pattern F3 on the first solid pattern F1. Then, the projector 440 stops emitting the pattern beam L3 to separate the third solid pattern F3 and the plane 121 from each other. Next, repeat the previous steps until the other photocured material is used for printing, so that the printing platform 330 leaves the accommodation space R43.

In sum, an embodiment of the invention can use at least two different kinds of the photocured materials or two photocured materials respectively appearing two different colors for printing processes by the separation mechanism (e.g. the movable partition or the nozzle), at least one container and a photocured material draining mechanism, thereby manufacturing a three-dimensional object composed of a variety of solid patterns (or having a variety of colors). Compared to the complicated conventional three-dimensional printing apparatus, the embodiment of the invention can use the abovementioned simple three dimensional printing apparatus to manufacture more various objects for various demands.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A three dimensional printing device, comprising:
   a plane, for putting a first photocured material and a second photocured material;
   a projector, configured to emit a light to cure the first photocured material and the second photocured material;
   at least one movable partition, disposed on the plane, and configured to separate the first photocured material and the second photocured material;
   a driving mechanism, configured to drive the at least one movable partition to move on the plane; and
   two outermost walls, fixed on the plane, wherein the at least one movable partition is located between the two outermost walls and configured to move relative to one of the two outermost walls.

2. The three dimensional printing device according to claim 1, wherein a third photocured material is further disposed on the plane, a number of the at least one movable partition is plural, and the movable partitions are configured to separate the first photocured material, the second photocured material, and the third photocured material from each other.

3. The three dimensional printing device according to claim 2, wherein the first photocured material is different from the second photocured material.

4. The three dimensional printing device according to claim 1, wherein the first photocured material is different from the second photocured material.

5. A three dimensional printing device, comprising:
   a plane, for putting a first photocured material and a second photocured material;
   a projector, configured to emit a light to cure the first photocured material and the second photocured material;
   a separation mechanism, disposed on the plane and configured to separate the first photocured material and the second photocured material from each other;
   a driving mechanism, for driving the separation mechanism to change a location of the first photocured material on the plane; and
   two outermost walls, fixed on the plane, wherein the separation mechanism is located between the two outermost walls.

6. The three dimensional printing device according to claim 5, wherein the separation mechanism comprises at least one movable partition, and the driving mechanism is configured to change a distance between the at least one movable partition and one of the two outermost walls.

7. The three dimensional printing device according to claim 5, wherein the separation mechanism comprises at least one movable partition.

8. The three dimensional printing device according to claim 5, wherein the separation mechanism comprises at least one nozzle.

9. The three dimensional printing device according to claim 5, wherein the plane is used to put a third photocured material, and the separation mechanism is configured to separate the first photocured material, the second photocured material, and the third photocured material from each other.

10. The three dimensional printing device according to claim 9, wherein the first photocured material is different from the second photocured material.

11. The three dimensional printing device according to claim 5, comprising:
   another projector, configured to emit a light to cure the first photocured material and the second photocured material; and
   a printing platform, being located above the plane and the projector located on two sides of the plane;
   wherein the projector is configured to emit a light to cure one of the first photocured material and the second photocured material, and the another projector is configured to emit a light to cure the other of the first photocured material and the second photocured material, the projector and the another projector are located on two sides of the plane.

12. The three dimensional printing device according to claim 11, wherein the first photocured material is different from the second photocured material.

13. The three dimensional printing device according to claim 11, wherein the separation mechanism comprises at least one movable partition.

14. The three dimensional printing device according to claim 11, wherein the separation mechanism comprises at least one nozzle.

15. The three dimensional printing device according to claim 11, wherein the plane is used to put a third photocured material, and the separation mechanism is configured to separate the first photocured material, the second photocured material, and the third photocured material from each other.

16. The three dimensional printing device according to claim 15, wherein the first photocured material is different from the second photocured material.

17. The three dimensional printing device according to claim 11, wherein the printing platform is adapted to move horizontally above the plane.

18. The three dimensional printing device according to claim 17, wherein the projector is adapted to move horizontally under the plane.

19. The three dimensional printing device according to claim 17, wherein the projector is configured to move synchronously with the printing platform.

20. The three dimensional printing device according to claim 11, wherein the three dimensional printing device comprises three projectors.

* * * * *